United States Patent [19]

Nishizawa et al.

[11] 4,326,209
[45] * Apr. 20, 1982

[54] STATIC INDUCTION TRANSISTOR

[75] Inventors: Jun-ichi Nishizawa, Sendai; Takashi Yoshida, Hamamatsu, both of Japan

[73] Assignee: Nippon Gakki Seizo Kabushiki Kaisha, Hamamatsu, Japan

[*] Notice: The portion of the term of this patent subsequent to Apr. 22, 1997, has been disclaimed.

[21] Appl. No.: 86,670

[22] Filed: Oct. 19, 1979

Related U.S. Application Data

[63] Continuation-in-part of Ser. No. 893,537, Apr. 4, 1978, Pat. No. 4,199,771.

[30] Foreign Application Priority Data

Nov. 7, 1977 [JP] Japan .................................. 52-41550

[51] Int. Cl.³ ............................................. H01L 29/80
[52] U.S. Cl. ........................................ 357/22; 357/15; 357/38; 357/92
[58] Field of Search ........................ 357/22, 15, 38, 92

[56] References Cited

U.S. PATENT DOCUMENTS

4,198,648  4/1980  Nishizawa ............................. 357/55
4,199,771  4/1980  Nishizawa et al. ................... 357/22
4,259,681  3/1981  Nishizawa ............................. 357/92
4,270,059  5/1981  Nishizawa et al. ................... 357/22

Primary Examiner—Joseph E. Clawson, Jr.
Attorney, Agent, or Firm—Cushman, Darby & Cushman

[57] ABSTRACT

A static induction transistor of the type wherein carriers are injected from a source to a drain across a potential barrier induced in a current channel and wherein the height of the potential barrier can be varied in response to a gate bias voltage applied to a gate and to a drain bias voltage applied to the drain to thereby control the magnitude of a drain current of the transistor. The product of the channel resistance $R_c$ and the true transconductance $G_m$ of the transistor is maintained less than one and the product of the true transconductance and the series resistance $R_s$ of the transistor is maintained greater than or equal to one in the low drain current region in the operative state of the transistor. The series resistance $R_s$ is the sum of a resistance of the source, a resistance from the source to the current channel, and the channel resistance from the entrance of the current channel to the position of maximum value (extrema point) of the potential barrier in the current channel. This static induction transistor has the advantage that the current-voltage characteristic curve is nearly linear over a very wide range of drain current including the low drain current region. In an upside-down structure, the above-mentioned conditions can be easily attained by selecting respective impurity concentrations and thicknesses of a substrate and an epitaxial layer grown thereon.

19 Claims, 23 Drawing Figures

STATIC INDUCTION TRANSISTOR

CROSS REFERENCE TO RELATED APPLICATION

This is a continuation-in-part of our copending application Ser. No. 893,537 filed Apr. 4, 1978 now U.S. Pat. No. 4,199,771.

BACKGROUND OF THE INVENTION (a) Field of the Invention

The present invention pertains to a static induction transistor which exhibits an unsaturated drain current-drain voltage characteristic, and more particularly it pertains to an improvement of the SIT characteristic at low values of the drain current.

(b) Description of the Prior Art

The static induction transistor (SIT), which is a kind of majority carrier injection control device having an unsaturated drain current-drain voltage characteristic similar to the plate current-plate voltage characteristic of triode vacuum tubes, has been proposed in Japanese Patent Application No. 46-28405 (the corresponding U.S. Patent Application Ser. No. 817,052) by Jun-ichi NISHIZAWA, one of the present inventors, and in Japanese Patent Application No. 46-57768 (the corresponding U.S. Patent Application Ser. No. 576,541) by Jun-ichi NISHIZAWA et al. The above-mentioned prior art SIT's are designed so that the product of the true transconductance and the series resistance of the SIT may be maintained lower than unity (one) at least in the operational range of low drain current irrespective of the magnitude of the gate voltage. Reference is also made to the Nishizawa U.S. Patent Application Ser. No. 757,583 filed Dec. 27, 1976.

Figure 1:
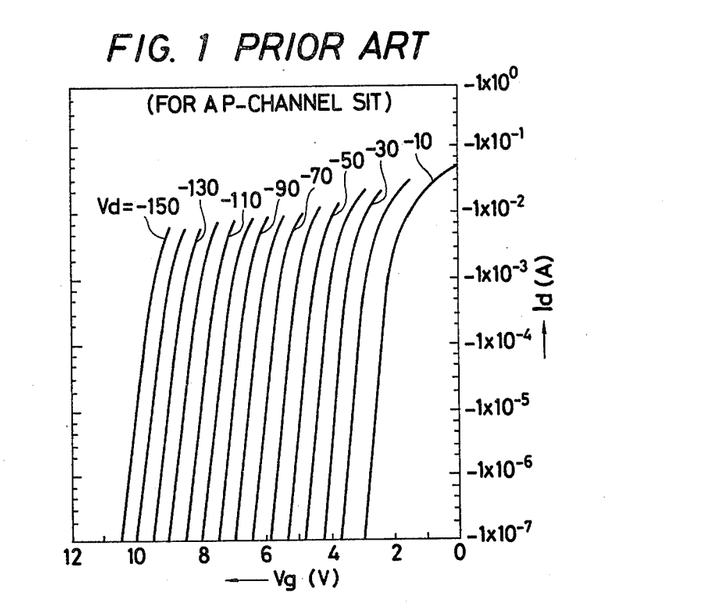
FIGS. 1 and 2 are graphical charts illustrating, in a semi-log scale, a typical example of the drain current-gate voltage characteristic and the drain current-drain voltage characteristic of an SIT according to the prior art, respectively.
Figure 2:
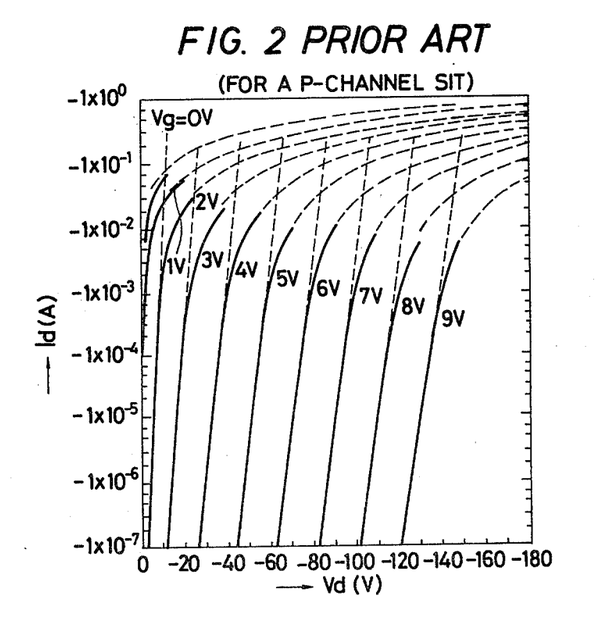

A typical gate voltage-drain current characteristic of the prior art SIT is plotted as the drain current $I_d$ versus the gate voltage $V_g$, with the drain voltage $V_d$ serving as a parameter in a semi-log scale in FIG. 1. The drain current-drain voltage characteristic is also plotted as $I_d$ versus $V_d$, with $V_g$ serving as a parameter in a semi-log scale in FIG. 2. In FIG. 2, the dashed portion of characteristic curves is measured by pulse technique. These Figures show the fact that, in the high drain current region, the drain current is nearly proportional to the drain voltage as well as to the gate voltage, but that, in the lower drain current region below approximately $1 \times 10^{-3}$ ampere for this specimen, both the drain current-drain voltage characteristic and the drain current-gate voltage characteristic are governed by an exponential rule. This non-linearity of the prior art SIT's at the low drain current region is considered to be the result of the barrier height control by the gate and drain voltages but to be responsible for the non-linear amplification (distortion) by the SIT in various applications. Accordingly, it is desirable to eliminate the non-linearity in the SIT response.

SUMMARY OF THE INVENTION

It is therefore, an object of the present invention to provide an improved SIT in which the current-voltage characteristic curve is nearly linear over a very wide range of drain current including the low drain current region.

Another object of the present invention is to provide an improved SIT which is capable of amplifying a signal with reduced non-linear amplification (distortion) and with wider dynamic range.

A further object of the present invention is to provide an improved static induction transistor of upside-down structure easy to manufacture and adapted for use in integrated circuits.

Another object of the present invention is to provide a static induction semiconductor device including a substrate held at a reference voltage and at least one improved static induction transistor of the type described including said substrate to serve as the source region.

In order to obtain an SIT which satisfies these requirements, the present inventors have made the following analysis and experiments on prior art SIT's.

In case the current channel of an SIT is rendered pinched-off by only an applied gate voltage, the drain current $I_d$ may be approximately expressed in terms of the gate voltage $V_g$ and drain voltage $V_d$ as:

$$I_d = I_0 \exp\left[-\frac{q}{kT}\eta\left\{\left(V_g + \frac{1+\mu}{\mu}r_s I_d\right) - \frac{V_d}{\mu}\right\}\right] \quad \text{Eq. 1}$$

wherein q, k and T represent the magnitude of electronic charge, Boltzmann constant and the absolute temperature, respectively. The term $\mu$ represents the voltage amplification factor of the SIT and $\eta$ represents the efficiency of the gate voltage, i.e. the ratio of the potential change at the potential barrier in the channel to the change of the apparent gate voltage. This ratio $\eta$ depends on the geometry and on the impurity profile of the SIT. $I_0$ is a constant which is determined by the geometry and the impurity profile in the SIT. The term $r_s$ represents the series resistance from the source up to the position of the maximum magnitude (extrema point) of the internal potential barrier. The position of the extrema of potential will hereinafter be referred to as the intrinsic gate of the SIT. The series resistance $r_s$ includes the resistance $R_{sr}$ of the source region itself, the resistance $R_{sc}$ from the source to the adjacent end (i.e. the entrance) of the current channel, and the channel resistance $R_c$ from the entrance of the current channel to the intrinsic gate (potential extrema point).

In the low drain current region where the drain current has such a small value that the term $(1+\mu)/\mu r_s I_d$ in Eq. 1 can be neglected as compared with other terms, the drain current may be expressed by the following simplified exponential formula, leading to the aforementioned exponential increase in the drain current at low values thereof.

$$I_d \approx I_0 \exp\left(-\frac{q}{kT}\eta\left(V_g - \frac{V_d}{\mu}\right)\right) \quad \text{Eq. 2}$$

On the other hand, where the drain current exceeds a certain critical value beyond which the term $(1+\mu)/\mu r_s I_d$ attains a significant value with respect to the gate voltage, the drain current tends to deviate from the exponential relationship of Eqs. 1 and 2. The drain current can thus be expressed by the following linear approximation:

$$I_d \approx \frac{V_d}{(1+\mu)r_s} - \frac{\mu V_g}{(1+\mu)r_s} + I_{const} \qquad \text{Eq. 3}$$

where $I_{const}$ is a constant which is determined by the geometry and the impurity profile of the SIT.

It can be noticed from the above discussion the the exponential characteristic of the drain current below the critical value is due to the effect of the series resistance, and that the critical value of the drain current, at which the drain current characteristic begins to deviate from the exponential rule into the linear rule, is dependent upon the value of the series resistance. More particularly, the larger the series resistance is, the smaller will be the critical value of the drain current, and vice versa. In other words, if the series resistance has a large (but not too large) value, the critical value of the drain current may become very small compared to the main operative drain currents. This assumption has been roughly confirmed by plotting the current-voltage characteristic of the measurement circuit of FIG. 3 employing a prior art SIT which has the product of the series resistance and the true transconductance $G_m$ being kept less than unity within the substantially entire range of the drain voltage and the drain current.

Figure 3:
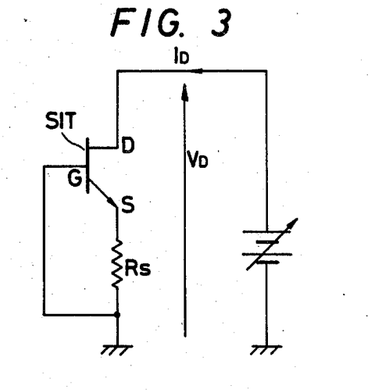
FIG. 3 is an electric circuit diagram showing a circuit employing an SIT of the prior art intended for the explanation of the present invention.
Figure 4:
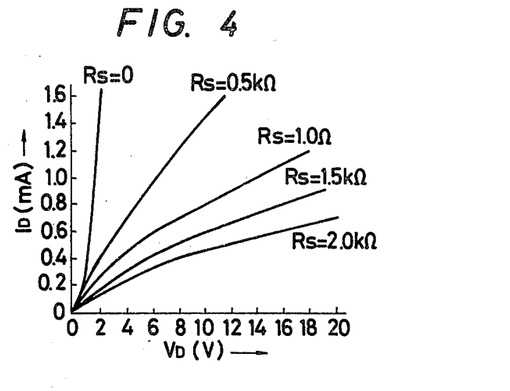
FIG. 4 is a graphical chart illustrating the current-voltage characteristic of the SIT circuit shown in FIG. 3.

In FIG. 3, an n-channel SIT has a drain D connected to the positive terminal of a variable dc power supply whose negative terminal is grounded, a gate G grounded and a source S grounded through a resistor $R_s$. The current-voltage characteristic of the circuit of FIG. 3 is plotted as current $I_D$ versus voltage $V_D$, with the resistance value of resistor $R_s$ serving as a parameter in linear scale in FIG. 4. This Figure suggests that an appropriate selection of the resistance value of the resistor $R_s$ will provide an improved current-voltage characteristic for the circuit shown in FIG. 3 wherein the current $I_D$ of the circuit will make a substantially linear increase in proportion to an increase in the applied voltage $V_D$ of the circuit over a wide current range including a very low current region. In this device of FIG. 3, a preferable additional resistance $R_s$ for providing a linear characteristic may be in the range from 0Ω to 0.5kΩ.

Moreover, the present inventors have made a further analysis of the series resistance $r_s$ in SIT. As previously described, the series resistance $r_s$ is the sum of three component resistances $R_{sr}$, $R_{sc}$ and $R_c$. The resistance of the source region $R_{sr}$ is determined mainly by the geometric dimensions and the impurity concentration of the source region, and therefore it is independent of the operating condition of the SIT. On the other hand, the resistance of the source-to-channel region $R_{sc}$ is somewhat dependent upon the SIT operating condition, because the depletion layer extending from the gate region and defining the current channel is dependent upon the operational condition of the device. When a reverse gate bias or a drain current is increased, the depletion layer grows accordingly to the increased potential difference, and thereby somewhat shortens the source-to-channel region. This shortening of the source-to-channel region leads to a decrease in the source-to-channel resistance $R_{sc}$. In contrast to these two resistances, the value of the channel resistance $R_c$ is very sensitive to the SIT operating condition, and therefore, this channel resistance will widely change in a highly sensitive manner according to the variations of the operating condition. The drain current saturation in conventional field effect transistors may be considered to derive mainly from the feedback effect induced by the channel resistance $R_c$. From this recognition, the condition $r_s \cdot G_m < 1$ for the prior art SIT is construed to be effective for providing the unsaturated drain current-drain voltage characteristic so long as the resistance $R_c$ is sufficiently minimized to provide a negligible extent of the feedback effect onto the operation of the SIT.

On the basis of the understanding stated above, the present inventors have come to the conclusion that the conditions of $R_c \cdot G_m < 1$ and $r_s \cdot G_m \geq 1$ in the low drain current region in the operative state of the SIT are essential to establish the improved SIT of the present invention. It should be noted that $G_m$ is designated as the true transconductance of the SIT.

Accordingly, the SIT of the present invention is characterized in that the value $R_c \cdot G_m$ is maintained less than unity, and also the value $r_s \cdot G_m$ is kept greater than or equal to unity. These conditions hold at least in the low drain current region in the operative state of the SIT. However, if the value $R_c \cdot G_m$ is slightly smaller than unity (comparable with unity) in the relatively low drain current region, the value $R_c \cdot G_m$ can become greater than unity in the high drain current region. The true transconductance $G_m$ increases with an increase in the drain current in a unipolar transistor, especially in a static induction transistor. Furthermore, the channel resistance $R_c$ may become large with an increase in the drain current.

In contrast to the present invention, with the prior art SIT, the first condition $R_c \cdot G_m < 1$ is satisfied, but the second condition $r_s \cdot G_m \geq 1$ is not established.

The relation between the overall apparent transconductance $G_m'$ of the whole device and the true transconductance $G_m$ is as follows. The existence of the channel resistance $R_c$, in effect, is reflected in a difference between the apparent and true transconductances of the SIT. The apparent transconductance $G_{mc}$ (considering only the effects of $R_c$) may be expressed as:

$$G_{mc} = G_m/(1+R_c \cdot G_m) \qquad \text{Eq. 4.}$$

The apparent transconductance $G_m'$ further reflects the existence of the resistance $R_{sc}$. That is, $G_m'$ varies if $R_{sc}$ is present. Where both $R_c$ and $R_{sc}$ are considered, the apparent transconductance $G_{ms}$ may be expressed as:

$$G_{ms} = \frac{G_{mc}}{1 + R_{sc} \cdot G_{mc}} \qquad \text{Eq. 5.}$$

$$= \frac{G_m}{1 + (R_{sc} + R_c)G_m}$$

Finally, the overall apparent transconductance $G_m'$ also accounts for resistance $R_{sr}$:

$$G_m' = \frac{G_{ms}}{1 + R_{sr} \cdot G_{ms}} \qquad \text{Eq. 6.}$$

$$= \frac{G_m}{1 + (R_{sr} + R_{sc} + R_c)G_m}$$

$$= \frac{G_m}{1 + r_s \cdot G_m}$$

The source region and the source-to-channel region are non-depleted regions. Therefore, the resistances of these regions are determined mainly by their geometry and resistivity. The resistance of each of these regions becomes high when the cross-section of these regions is made small, the length thereof is made long, and/or the resistivity thereof is made high.

These and other objects as well as the advantageous features of the present invention will become apparent by reading the following description of the preferred embodiments when taken in conjunction with the accompanying drawings.

BRIEF DESCRIPTION OF THE DRAWINGS

FIGS. 18 and 19 are diagrammatic illustrations of an upside-down structure SIT, in which:

DETAILED DESCRIPTION OF THE PREFERRED EMBODIMENTS

Figure 5:
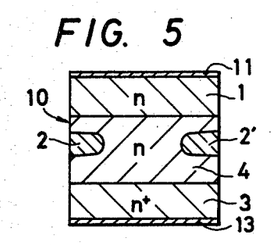
FIGS. 5 through 11 are diagrammatic vertical sections of improved SIT's of the single-channel type.
Figure 6:
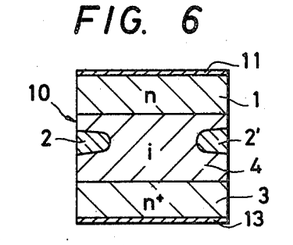

FIGS. 5 and 6 are respectively intended to show, in vertical section, the basic geometric structure of an improved SIT according to the present invention, which includes a semiconductor body 10 (e.g. silicon, germanium and gallium arsenide) comprising a semiconductor layer 1 of a first conductivity type, e.g. n-type, a semiconductor layer 3 of the first conductivity type, and a semiconductor layer 4 of the first conductivity type as shown in FIG. 5 or of the substantially intrinsic type as shown in FIG. 6. On the outer surfaces of the respective layers 1 and 3 are formed a source electrode 11 and a drain electrode 13, thus these layers being operative as a source and a drain region of the SIT, respectively. At the opposite sides of the semiconductor layer 4, there are provided semiconductor regions 2 and 2' of a second conductivity type, e.g. p-type, which is opposite to the first conductivity type, so as to protrude inwardly to face each other. These semiconductor regions 2 and 2' function as the gate regions of the SIT, and they may be formed discrete or in a continuous form like a ring shape or a stripe shape, for instance. Gates 2 and 2' define a current channel, in the semiconductor layer 4, of the SIT. Gate electrodes which make ohmic contacts to the gates 2 and 2' are not illustrated in FIGS. 5 and 6 for the simplicity of the Figures.

In the known SIT according to the prior art, the source is composed of a relatively heavily impurity-doped material having a relatively high impurity concentration between the orders of $10^{24}$ and $10^{27}$ atoms/m$^3$ so that the source resistance $R_{sr}$ may be as small as possible and thus satisfies the condition $r_s \cdot G_m < 1$.

In contrast thereto, according to the present invention, the source 1 may be made of a relatively lightly impurity-doped material having a relatively low impurity concentration between the orders of $10^{21}$ atoms/m$^3$ and $10^{23}$ atoms/m$^3$ so that the source resistance $R_{sr}$ will have a sufficiently large value for satisfying the condition $r_s \cdot G_m \geq 1$. The source resistance may also be adjusted by the geometry of the source region 1. The condition $r_s \cdot G_m \geq 1$ may also be satisfied by increasing the source-to-channel resistance $R_{sc}$ and/or the channel resistance $R_c$. The source-to-channel resistance $R_{sc}$, although it is almost negligible in the structures of FIGS. 5 and 6, can be increased by increasing the distance from the source to the channel entrance and/or by raising the resistivity of that region. The channel resistance may be increased by elongating the gate region along the source-to-drain direction and/or selecting a higher impurity concentration (lower resistivity) of that region so as to form a narrow and/or lengthy channel. The operating condition of the SIT gives a large effect to the channel resistance $R_c$ and some effect to the source-to-channel resistance $R_{sc}$. The resistivity conditions for the gates 2 and 2', the drain 3 and the channel 4 may be almost the same as those in the prior art SIT. Accordingly, the gate-constituting material usually has an impurity concentration between the orders of $10^{23}$ atoms/m$^3$ and $10^{27}$ atoms/m$^3$; the drain-constituting material has an impurity concentration between the orders of $10^{23}$ atoms/m$^3$ and $10^{27}$ atoms/m$^3$; and the channel-constituting material has an impurity concentration between the orders of $10^{18}$ atoms/m$^3$ and $10^{22}$ atoms/m$^3$. It should be noted, however, that the impurity concentration for the channel is dependent upon the distance between the gates, the length of the gates along the drain-current-flowing direction, and the operating condition where the SIT is to be used. For an SIT for use in large power applications, the impurity concentration of the channel-constituting material and the gate distance should be determined so that the central portion of the channel is not completely depleted by the diffusion potential of the gates (with no gate bias voltage applied). On the other hand, an SIT of the normally-off type (in which the SIT is in the cut-off state at zero gate bias voltage), the gate distance and the channel impurity concentration should both be determined so that the channel may be completely closed, i.e. pinched off, by the depletion layers produced by the gate to channel diffusion potential extending from the gates. In the latter case, if the channel impurity concentration is set, for instance at $1 \times 10^{19}$ atoms/m$^3$, $1 \times 10^{20}$ atoms/m$^3$ and $1 \times 10^{21}$ atoms/m$^3$, the gate distance is determined less than 20 μm, 7 μm and 2 μm, respectively. It is needless to say that both the geometric dimensions and the channel impurity concentration must satisfy the above-described condition $R_c \cdot G_m < 1$ at least in the low drain current region in the operative state of the SIT of the present invention.

Figure 7:
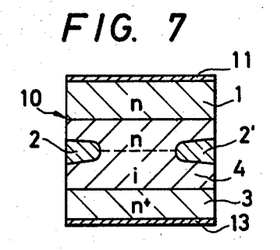
Figure 8:
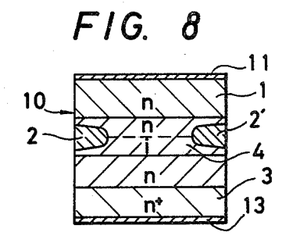
Figure 9:
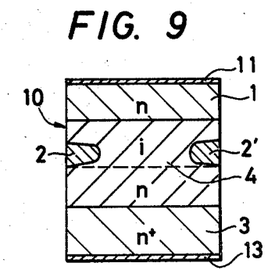
Figure 10:
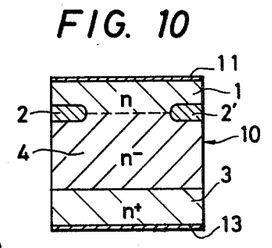
Figure 11:
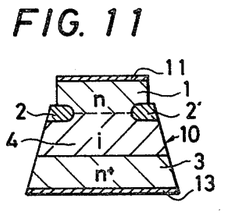

Several possible modifications of the impurity profile in the improved SIT are illustrated in FIGS. 7 through 11. In FIG. 7, the semiconductor layer 4 is formed with a relatively lightly doped n type layer which may be used for adjusting the source-to-channel resistance, and a substantially intrinsic i type layer. In FIG. 8, the semiconductor layer 4 is composed of a relatively lightly-doped n type layer and a substantially intrinsic i type layer, and further, a relatively lightly-doped n type layer inserted between the i type layer and the drain 3. FIG. 9 shows a modification wherein a relatively lightly-doped n type layer is provided between the semiconductor layer 4 and the drain 3. In FIGS. 10 and 11 are shown further modifications wherein the gates 2 and 2' are positioned along the boundary between the source 1 and the semiconductor layer 4 (a lightly doped n⁻ type layer in FIG. 10 or intrinsic i type layer in FIG. 11). Moreover, in the SIT shown in FIG. 11, the source 1 is formed smaller in cross sectional area as compared with that of the semiconductor layer 4, in order to effectively increase the source resistance $R_{sr}$ even for a reduced thickness of the source.

Figure 12:
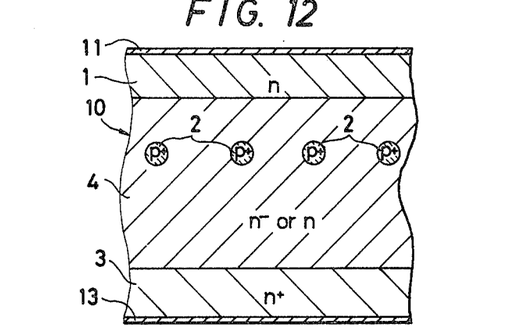
FIGS. 12 through 17 are diagrammatic vertical sections of improved SIT's of the multi-channel type.

A basic geometric structure of the SIT of the multichannel type is shown in FIG. 12, wherein there is formed mesh-like or grid-like gates 2 with highly impurity-doped semiconductor of the second conductivity type, and wherein a plurality of separated current channels are defined between the adjacent respective gates 2 in the semiconductor layer 4. The geometric dimensions of the respective gates 2, and the impurity concentrations in the source region 1 and in the respective current channels are determined in almost the same manner as in the single-channel type SIT described above so that both of the conditions $r_s \cdot G_m \geq 1$ in the low drain current region in the operative state of the SIT may be satisfied for the overall transistor.

Figure 13:
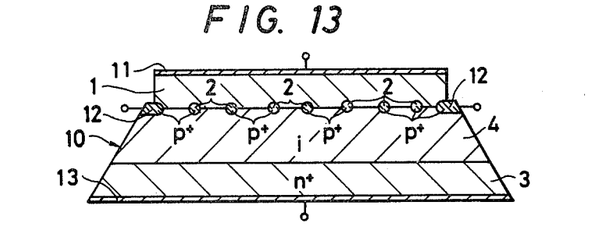

A more practical example of the multi-channel type SIT of the present invention is shown in FIG. 13, wherein a plurality of gates 2 are formed in line along the boundary between the relatively lightly doped n type layer 1 and the substantially intrinsic i type layer 4, and wherein the layer 1 which works mainly as the source of the SIT is formed narrower in cross section than the layer 4 so as to produce a higher value of the source resistance $R_{sr}$. All of the gates 2 are formed continuous and led out in common at lead layers 12 provided at the opposite sides of the crystal 10.

A variety of structures of the SIT which are effective for enhancing the source-to-gate breakdown voltage and for decreasing the source-to-gate capacitance will hereinafter be explained with reference to FIGS. 14 through 17.

Figure 14:
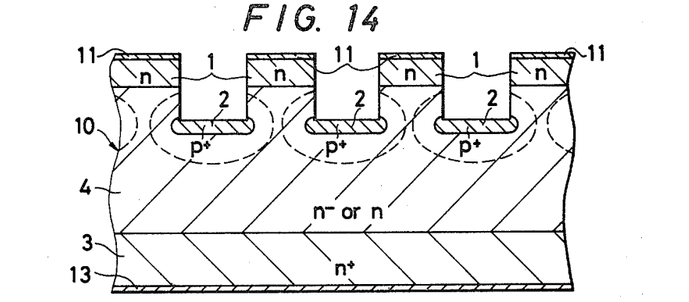

In the SIT shown in FIG. 14, those portions of the source 1 and the layer 4 which are positioned over the respective gates 2 are cut away to make the effective cross sections thereof smaller, thereby increasing the source resistance $R_{sr}$ and the source-to-channel resistance $R_{sc}$ and at the same time for achieving both a reduced source-to-gate capacitance and an increased source-to-gate breakdown voltage.

Figure 15:
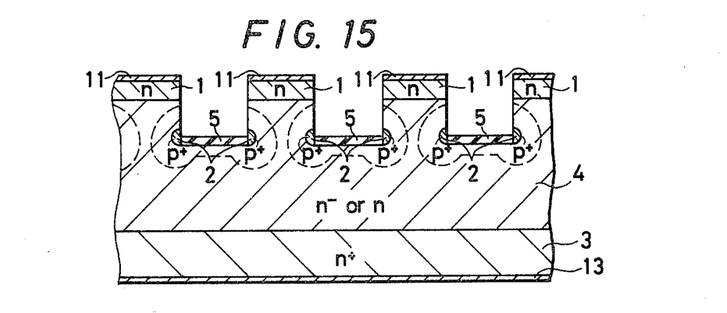

In FIG. 15, exposed portions of the gates 2, excepting the side edge portions of the gate regions which can be considered to really function as the gate regions, are cut away, and insulating layers 5 are deposited in place of those cut-away portions, in order to reduce the net area of the gates 2 to thereby further reduce the source-to-gate capacitance. The other arrangements and the advantages of this example are the same as those of the above-mentioned example in FIG. 14.

Figure 16:
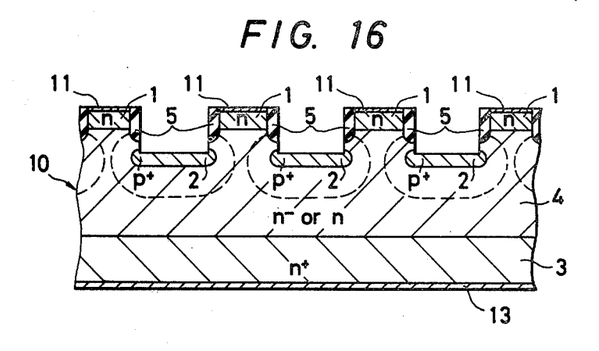

The SIT shown in FIG. 16 is arranged so that the exposed side portions of the source 1 and the exposed top side portions of the layer 4 are cut away and that insulating layers 5 are formed on those cut-away portions. This structure can provide the SIT with a further increased series resistance $r_s$ including the source resistance $R_{sr}$ and the source-to-channel resistance $R_{sc}$. The other arrangements and advantages of this example are the same as those of FIG. 14.

Figure 17:
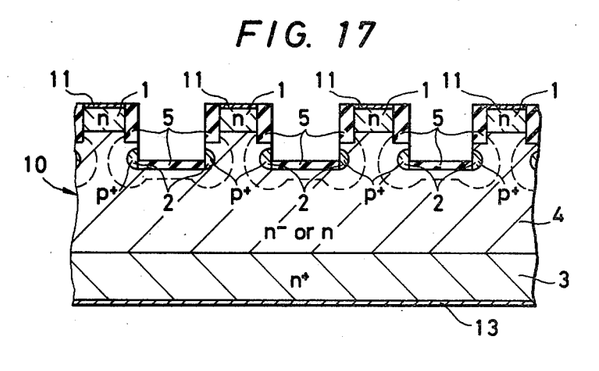

The SIT shown in FIG. 17 is a combination of the arrangements of both examples shown previously in FIGS. 15 and 16.

Throughout FIGS. 15 to 17, the afore-mentioned insulating layers 5 may be formed by any one of insulating materials $SiO_2$, $Si_3N_4$, $Al_2O_3$ and so on, and the combinations thereof for example, or said layers 5 may be formed by a lamination of two or more of these materials. Needless to say, dotted lines in these Figures illustrate the shapes of the depletion layers extending from the respective gates 2 into the current channels when the gates are applied with a certain forward- or reverse-bias voltage. The thicknesses of these depletion layers are controlled to vary in accordance with the gate bias voltage applied, with the result that the heights of the extrema points of potential barriers which are induced in the current channels will change in response to the applied gate bias voltage to control the injection of majority carriers from the source to the drain across the potential barriers in the current channels.

Furthermore, in FIGS. 5 through 17 and in the previous description, the typical impurity concentrations for the regions labeled i, n, p, n⁻, n⁺, p⁺ may be as follows.

| Symbol | corresponding typical impurity concentration |
|---|---|
| i | about $10^{18}$ atoms/m³ |
| n³¹ | about $10^{20}$–$10^{21}$ atoms/m³ |
| n, p | about $10^{22}$ atoms/m³ |
| n⁺, p⁺ | about $10^{24}$–$10^{27}$ atoms/m³ |

Figure 18:
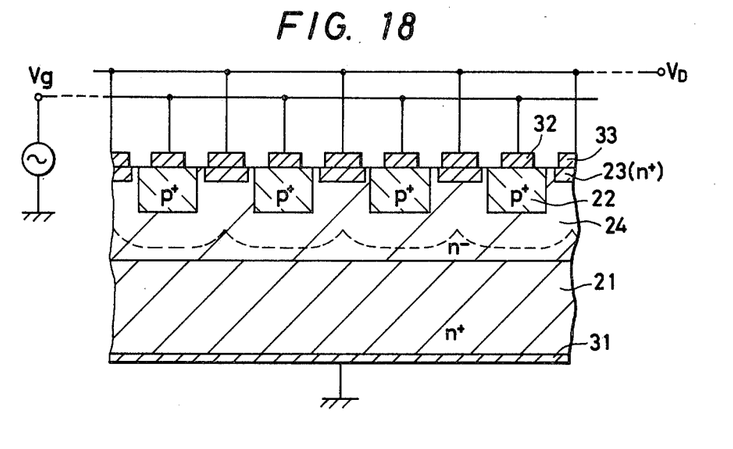
FIG. 18 is a vertical sectional view.
Figure 19:
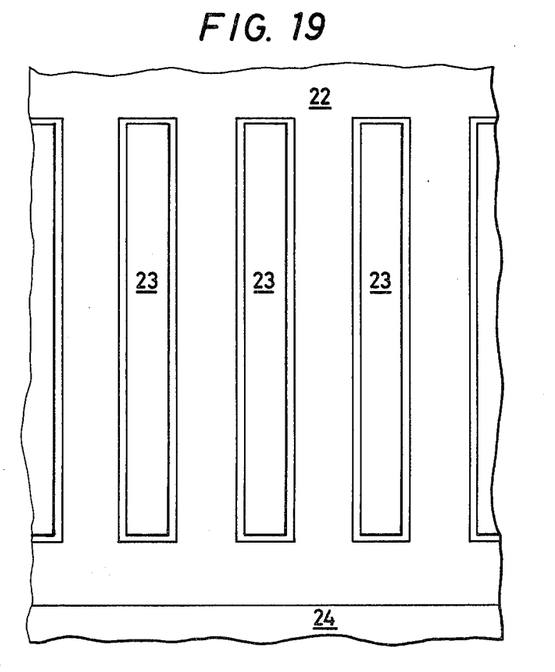
FIG. 19 is an explanatory top plan view.

FIGS. 18 and 19 show an upside-down structure SIT wherein the substrate is used as a source region. In FIG. 18, an n⁻ type silicon epitaxial layer 24 is grown on an n⁺ type silicon substrate 21 which serves as a source region. A p⁺ type heavily doped gate region 22 having through-apertures is formed in the surface of the epitaxial layer 24, and n⁺ type heavily doped drain regions 23 are formed within these apertures by diffusion, ion implantation, or like technique (see FIG. 19). Source, gate and drain electrodes 31, 32 and 33 of a conducting material are deposited on the source, gate and drain regions 21, 22 and 23, respectively. As seen in FIGS. 18 and 19, this SIT has a plurality of drains, which are connected in common by electrode or wiring to form a single drain output. Each drain region 23 is spaced from the gate region 22 in each aperture for reducing the gate-drain capacitance and for increasing the gate-drain breakdown voltage.

Although the Figures show partially exaggerated views, the substrate 21 has a thickness much larger than that of the epitaxial layer 24. Thus, the source resistance $R_{sr}$ can be easily increased to an appropriate value. Further, the source-to-channel resistance $R_{sc}$ also can be easily increased by increasing the thickness of the epitaxial layer. In other words, an upside-down SIT having an appreciable resistance from the source electrode to the entrance of the channel is easy to manufacture. In case the substrate is used as the source, a heat sink can be easily connected to the source, and hence an SIT installed in a grounded metal housing can be provided.

The channel width, i.e. gate-to-gate distance, and the impurity concentration of the channel region, i.e. the epitaxial layer, are subjected to many limitations such as the desired operational specifications and the technical problems of manufacture. On the other hand, the thickness of the epitaxial layer can be relatively easily adjusted. Namely, the thickness of the epitaxial layer may be decreased for decreasing the source-to-channel resistance, or may be increased for increasing the source-to-channel resistance.

The source resistance can be adjusted widely by adjusting the thickness and the impurity concentration of the substrate 21, as described previously. Further, the source resistance can be increased by such means, for example, as partially removing the source electrode 31, or lightly doping a p type impurity in the lower surface portion of the substrate 21. It is to be noted that the source resistance for each channel is determined mainly by the vertical resistance of an associated portion in the substrate located below that channel. Thus, it is easy to raise a resistance for each channel to some extent while maintaining the lateral resistance of the substrate at a sufficiently low value.

In the structure of FIGS. 18 and 19, the distance between the gate and the drain regions is rather short, and thereby the gate-drain capacitance cannot be made very small and the gate-drain breakdown voltage cannot be made very high as will be understood by those skilled in the art. For improving the high frequency and high power operation, it is desirable to increase the gate-to-drain distance.

Figure 20:
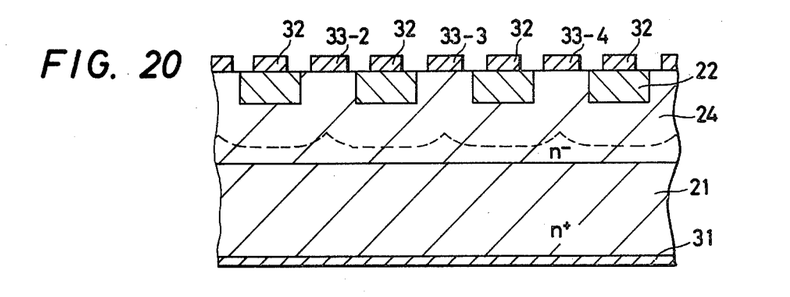
FIG. 20 is a diagrammatic vertical sectional view of an upside-down type SIT having a Schottky drain electrode.

FIG. 20 shows a Schottky drain upside-down SIT which has a structure similar to that of FIG. 18 except for the fact that there are no heavily doped drain regions. Namely, Schottky drain electrodes 33-2, 33-3, 33-4 are formed directly on the epitaxial layer 24. Elimination of the heavily doped drain region serves to allow a shallower gate depth, a smaller gate-to-gate distance and an easier process of manufacture. For example, the number of masks can be reduced, the gate region can be formed easily by ion-implantation, or like techniques. Further, the gate-drain capacitance can be decreased due to the elimination of the semiconductor drain region. Although the gate electrode 32 and the drain Schottky electrode 33 have different requirements due to their respective specific functions, they can be formed with a same material and by a same manufacturing process.

The simplified structure of FIG. 20 makes the materialization of a GaAs SIT easier. The source resistance $R_{sr}$ and the source-to-channel resistance $R_{sc}$ can be adjusted easily in much the same way as for the structure of FIGS. 18 and 19.

The employment of gallium arsenide (GaAs) as the semiconductor material enables a wider channel width (i.e. gate-to-gate distance) due to its wider forbidden band gap and provides a higher speed operation due to its higher carrier mobility, as compared with silicon (Si) devices.

It will be understood that the drain of a unipolar transistor including SIT functions to retrieve carriers supplied from the source. Therefore, a metal (Schottky) drain region can attain a function similar to that of a heavily doped semiconductor drain except for the fact that a Schottky electrode is usually accompanied by a Schottky barrier. The height of the Schottky barrier can be selected sufficiently low through the selection of the materials of the semiconductor and the metal and through the selection of the manufacturing process for formfing the Schottky electrode.

Figure 21:
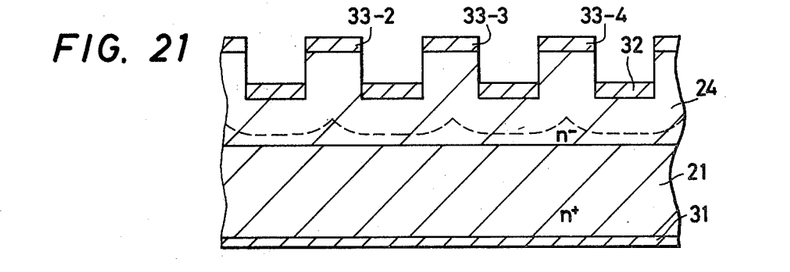
FIG. 21 is a diagrammatic vertical sectional view of an upside-down type recessed-gate SIT.

FIG. 21 shows a recessed-gate structure SIT which enhances the high speed and high power operation.

The epitaxial layer 24 is partially etched away by directive plasma etching or like techniques to form recessed portions surrounding protruding channel portions. Gate means 32 for controlling the carrier transport in the channel regions (including said protruding channel portions as well as the drain means) are formed with Schottkky electrodes (33-2, 33-3, 33-4) in FIG. 21. Self alignment techniques can be employed to form the gate electrode and the drain electrodes in a single process. Vertical separation of the gate electrode and the drain electrodes improves the gate-drain capacitance and the gate-drain breakdown voltage.

It will be apparent that similar structures can be formed by other processes such as selective epitaxial growth. Also, it will be apparent that the upside-down recessed gate structure can be materialized in junction gate and/or junction drain structures (see FIGS. 14 to 17).

Figure 22:
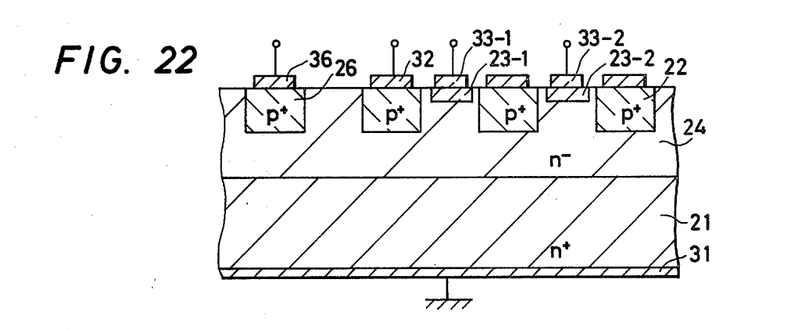
FIG. 22 is a diagrammatic vertical sectional view of a multi-output IIL type semiconductor device.

The upside-down structure is particularly adapted for use in an integrated circuit. FIG. 22 shows an IIL type structure utilizing an SIT similar to that of FIGS. 18 and 19.

An n⁻ type epitaxial layer 24 is grown on an n+ type substrate 21, and p+ type regions 22, 26 and n+ type regions 23-1, 23-2 are formed in the n⁻ type epitaxial layer. Conductive electrodes 31, 32, 33-1, 33-2, 36 are formed on the respective heavily doped regions 21, 22, 23-1, 23-2 and 26. The electrode 36 is connected to a positive power supply, and the p+ type region 26 serves as an injector region. That portion of the epitaxial layer 24 sandwiched between the p+ type regions 26 and 22 serves as a grounded base region. This base region may be totally or almost depleted. The semiconductor regions 21, 24, 22 and 23-1 or 23-2 serve as a source, a channel, a gate and a drain region, respectively. Namely, the structure of FIG. 22 represents a multi-output IIL type circuit. A multi-drain SIT serves as a multi-drain inverter transistor. It will be apparent that the multi-drain upside-down SIT may be formed by other structures such as that shown in FIG. 21.

Figure 23:
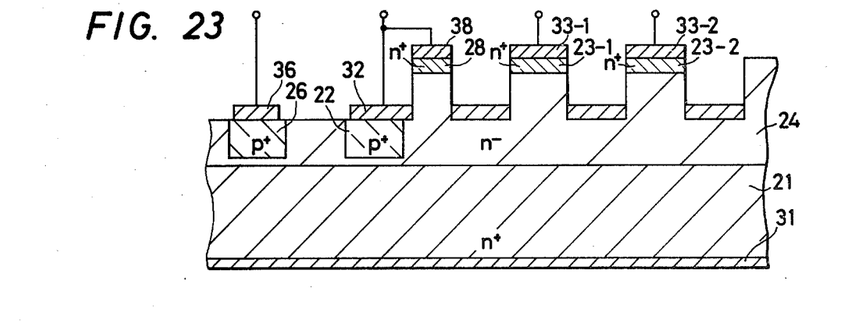
FIG. 23 is a diagrammatic vertical sectional view of a modification of the IIL type semiconductor device shown in FIG. 22.

FIG. 23 shows a modification of an IIL type circuit. In the Figure, an n⁻ type epitaxial layer 24 is grown on an n+ type substrate 21. A thin n+ type layer 23 is formed in the surface portion of the epitaxial layer by successive epitaxial growth, diffusion or ion implantation. Selective etching is carried out to form recessed portions. An emitter region 26 and a collector region 22 of an injector bipolar transistor is formed by p+ type diffusion or ion implantation in that portion of the n⁻ type epitaxial layer having a reduced thickness. Conductive electrodes 31, 32, 33-1, 33-2, 36 and 38 are formed on the semiconductor regions 21, 22 (and 24), 23-1, 23-2, 26 and 28, respectively. The collector electrode 32 of the injector transistor extends through a wide area on the epitaxial layer 24 to serve as a Schottky gate electrode. The drain region 28 of the upside-down multi-drain SIT is connected to the Schottky gate electrode 32 through the electrode 38. Namely, the multi-drain SIT has one drain 28 connected to its gate for forming a bypass transistor. The channel region of this bypass transistor is designed narrower than other channels of the device to afford a desired characteristic to the bypass transistor. The bypass transistor allows an excess injection current to flow directly to the source region 21. The Schottky gate forms a Schottky barrier with the n⁻ type epitaxial layer, which affords a rectifying property to the gate electrode.

In the structures shown in FIGS. 20 to 23, the resistance from the source to the channel entrance is selected appropriately by the selection of the resistivity and the thickness of the substrate 21 and of the epitaxial layer 24, similar to the case of FIGS. 18 and 19, for satisfying the condition $r_2 \cdot G_m \geq 1$, while satisfying the condition $R_c \cdot G_m < 1$ in the low drain current region in the operative state of the device.

Description has been made of some limited embodiments of n-channel SIT's, but it will be apparent that various modifications and alterations are possible within the scope of the present invention. For example, p-channel SIT's can be formed by inverting the conductivity types of all of the semiconductor regions, and insulated gate SIT's can be formed by modifying the gate structure (and inverting the conductivity type of the channel region, when necessary).

What is claimed is:

1. In a semiconductor device of the type comprising:
   a first semiconductor region of a first conductivity type and having a first predetermined doping characteristic and first predetermined dimensions;
   a second semiconductor region of a conductivity type not opposite to said first conductivity type and having a second predetermined doping characteristic and second predetermined dimensions;
   a third conductive region of third predetermined dimensions;
   said first and second semiconductor regions and said third conductive region being relatively disposed such that said first semiconductor region is adjacent said second semiconductor region and said second semiconductor region is adjacent said third conductive region to provide a current path through said first, second and third regions; and
   gate means, responsive to a bias signal applied thereto, for producing, even at zero value of said bias signal, a depletion layer extending into said second semiconductor region to define a current channel in said second semiconductor region and at least nearly pinch off said current path at a point in said current channel,
   said first predetermined doping characteristic and said first predetermined dimensions defining a resistance parameter $R_{sr}$ with respect to the portion of said current path through said first region,
   said second predetermined doping characteristic and second predetermined dimensions in conjunction with said gate means defining a resistance parameter $R_{sc}$ with respect to the portion of said current path through said second semiconductor region between said first semiconductor region and the beginning of said current channel along said current path closest to said first semiconductor region and defining a resistance parameter $R_c$ with respect to the portion of said current path through said second semiconductor region between said beginning of said current channel and said point in said current channel whereat said depletion layer at least nearly pinches off said current path,
   said device exhibiting an apparent transconductance $G_m'$ related to the true transconductance of said device as $G_m' = G_m / \{1 + (R_{sr} + R_{sc} + R_c) G_m\}$,
   the improvement wherein:
   said first and second doping characteristics, said first and second dimensions are of values such that, over a substantial portion of the operational range of said device:
   the product $R_c \cdot G_m$ is less than unity; and
   the product $(R_{sr} + R_{sc} + R_c) \cdot G_m$ in greater than or equal to unity;
   whereby said device exhibits a nearly linear current-voltage response.

2. The semiconductor device of claim 1, wherein: said second semiconductor region has an impurity concentration of less than the order of $10^{22}$ atoms/m³.

3. The semiconductor device of claim 1, wherein: said first semiconductor region has an impurity concentration between the order of $10^{21}$ atoms/m³ and the order of $10^{23}$ atoms/m³, said second semiconductor region has an impurity concentration between the order of $10^{18}$ atoms/m³ and the order of $10^{22}$ atoms/m³.

4. The semiconductor device of claim 1, 2 or 3, wherein: said gate means comprises at least one fourth semiconductor region having a second conductivity type opposite to said first conductivity type, disposed adjacent said second semiconductor region.

5. The semiconductor device of claim 1, wherein: said first and second predetermined dimensions are such that the cross section of said first semiconductor region is smaller than the cross section of said second semiconductor region.

6. The semiconductor device of claims 1, 2 or 3, wherein: said gate means comprises a pair of semiconductor layers each having a second conductivity type opposite to said first conductivity type disposed at opposite sides of said second semiconductor region.

7. The semiconductor device of claims 1, 2 or 3, wherein: said means comprises a plurality of semiconductor fingers of a second conductivity type opposite to said first conductivity type disposed spaced apart in said second semiconductor region.

8. The semiconductor device of claim 1, wherein: said first semiconductor region includes a semiconductor substrate.

9. The semiconductor device of claim 8, wherein: said second semiconductor region is formed by a part of an epitaxial layer formed on said substrate, and said substrate has a thickness greater than that of the epitaxial layer.

10. The semiconductor device of claim 8 or 9, wherein: said third conductive region includes a metal electrode deposited on said second semiconductor region forming a Schottky contact with this second semiconductor region.

11. The semiconductor device of claim 8 or 9, wherein: said gate means includes a metal electrode deposited on said second semiconductor region and forming a Schottky contact with this second semiconductor region.

12. The semiconductor device of claim 11, wherein: said third conductive region includes a semiconductor region of said first conductivity type having a low resistivity.

13. The semiconductor device of claim 9, wherein: said epitaxial layer has at least one recessed surface, and said gate means is formed in said recessed surface.

14. The semiconductor device of claim 13, further comprising: an injector bipolar transistor comprised of a fourth and a fifth semiconductor region both having said second conductivity type and a low resistivity and being formed in said epitaxial layer, and also comprised of another part of said epitaxial layer sandwiched between said fourth and fifth semiconductor regions, the fourth semiconductor region, said part of the epitaxial layer and said fifth semiconductor region jointly constituting a current path, said fifth semiconductor region being electrically connected to said gate means.

15. The semiconductor device of claim 14, wherein: said fourth and fifth semiconductor regions are formed in the epitaxial layer below said recessed surface, and said gate means includes a metal electrode deposited on said epitaxial layer and forming a Schottky contact with said recessed surface of this epitaxial layer and electrically connected with said fifth semiconductor region.

16. In a semiconductor device of the type comprising:

a semiconductor substrate including a first semiconductor region of a first conductivity type and having a first predetermined doping characteristic and first predetermined dimensions;

an epitaxial semiconductor layer including a second semiconductor region of a conductivity type not opposite to said first conductivity type and having a second predetermined doping characteristic and second predetermined dimensions;

a third semiconductor region of said first conductivity type having a third predetermined doping characteristic and third predetermined dimensions and formed in said epitaxial layer, said first, second and third semiconductor regions being relatively disposed such that said first semiconductor region is adjacent said second semiconductor region and said second semiconductor region is adjacent said third semiconductor region to provide a current path through said first, second and third semiconductor regions; and gate means, responsive to a bias signal applied thereto, for producing, even at zero value of said bias signal, a depletion layer extending into said second semiconductor region to define a current channel in said second semiconductor region and at least nearly pinch off said current path at a point in said current channel, said first predetermined doping characteristic and said first predetermined dimensions defining a resistance parameter $R_{sr}$ with respect to the portion of said current path through said first region, said second predetermined doping characteristic and second predetermined dimensions in conjunction with said gate means defining a resistance parameter $R_{sc}$ with respect to the portion of said current path through said second semiconductor region between said first semiconductor region and the beginning of said current channel along said current path closest to said first semiconductor region and defining a resistance parameter $R_c$ with respect to the portion of said current path through said second semiconductor region between said beginning of said current channel and said point in said current channel whereat said depletion layer at least nearly pinches off said current path, said device exhibiting an apparent transconductance $G_m'$ related to the true transconductance of said device as $G_m' + G_m/\{1 + (R_{sr} + R_{sc} + R_c)G_m\}$, the improvement wherein:

said first and second doping characterisitics, said first and second dimensions are of values such that, over a substantial portion of the operational range of said device:

the product $R_c \cdot G_m$ is less than unity; and the product $(R_{sr} + R_{sc} + R_c) \cdot G_m$ is greater than or equal to unity, whereby said device exhibits a nearly linear current-voltage response.

17. The semiconductor device of claim 16, wherein: said epitaxial layer has at least one portion of reduced thickness, and the device includes a fourth and a fifth semiconductor region of said second conductivity type and a low resistivity and formed in said portion of the reduced thickness, a sixth semiconductor region of said first conductivity type and a high resistivity disposed in said portion of reduced thickness between said fourth and fifth semiconductor regions, and said gate means includes a metal electrode deposited on said portion of the reduced thickness and forming a Schottky contact with said second semiconductor region and electrically connected with said fifth semiconductor region.

18. The semiconductor device of claim 16 or 17, wherein:

said epitaxial layer further includes: a seventh semiconductor region of a conductivity type not opposite to said first conductivity type and having a seventh predetermined doping characteristic and seventh predetermined dimensions; and an eighth semiconductor region of said first conductivity type having an eighth predetermined doping characteristic and eighth predetermined dimensions, said first, seventh and eighth semiconductor regions being relatively disposed such that said first semiconductor region is adjacent said seventh semiconductor region and said seventh semiconductor region is adjacent said eighth semiconductor region to provide another current path through said first, seventh and eighth semiconductor regions, said gate means producing, responsive to said bias signal applied thereto even at zero value of said bias signal, a depletion layer extending into said seventh semiconductor region to define a current channel in said seventh semiconductor region and at least nearly pinching off said another current path at a point in said current channel.

19. The semiconductor device of claim 8, further comprising: an injector bipolar transistor comprised of a fourth and a fifth semiconductor region both having said second conductivity type and a low resistivity and being formed in said epitaxial layer, and also comprised of another part of said epitaxial layer sandwiched between said fourth and fifth semiconductor regions, the fourth semiconductor region, said part of the epitaxial layer and said fifth semiconductor region jointly constituting a current path, said semiconductor region being electrically connected to said gate means.

* * * * *

UNITED STATES PATENT AND TRADEMARK OFFICE
CERTIFICATE OF CORRECTION

PATENT NO. : 4,326,209
DATED : April 20, 1982
INVENTOR(S) : Jun-ichi NISHIZAWA, Takashi YOSHIDA It is certified that error appears in the above—identified patent and that said Letters Patent is hereby corrected as shown below:

On the title page

Please add to Item [73] the following omitted Assignee:

--Zaidan Hojin Handotai Kenkyu Shinkokai
  Sendai, Japan--

Signed and Sealed this

Fourteenth Day of September 1982

[SEAL]

*Attest:*

*Attesting Officer*

GERALD J. MOSSINGHOFF

*Commissioner of Patents and Trademarks*